(12) United States Patent
Dai

(10) Patent No.: US 10,115,362 B2
(45) Date of Patent: Oct. 30, 2018

(54) SCAN-DRIVING CIRCUIT

(71) Applicant: Shenzhen China Star Optoelectronics Technology Co., Ltd., Shenzhen (CN)

(72) Inventor: Chao Dai, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 324 days.

(21) Appl. No.: 14/774,147

(22) PCT Filed: Jul. 17, 2015

(86) PCT No.: PCT/CN2015/084339
§ 371 (c)(1),
(2) Date: Sep. 10, 2015

(87) PCT Pub. No.: WO2017/004849
PCT Pub. Date: Jan. 12, 2017

(65) Prior Publication Data
US 2017/0004795 A1    Jan. 5, 2017

(30) Foreign Application Priority Data
Jul. 3, 2015  (CN) .......................... 2015 1 0387843

(51) Int. Cl.
*G09G 3/36*         (2006.01)
*G11C 19/00*        (2006.01)
(52) U.S. Cl.
CPC ........... *G09G 3/3677* (2013.01); *G11C 19/00* (2013.01); *G09G 2310/0286* (2013.01); *G09G 2330/08* (2013.01)

(58) Field of Classification Search
CPC ....... G09G 2310/02; G09G 2310/0264; G09G 2310/0267; G09G 2310/0286; G09G 2330/08; G11C 19/00
USPC .................................. 345/204, 214, 55, 100
See application file for complete search history.

(56) References Cited

U.S. PATENT DOCUMENTS

| 9,576,677 B2 * | 2/2017 | Dai ..................... G09G 3/3677 |
| 2012/0242630 A1 | 9/2012 | Ohara |
| 2014/0103983 A1 * | 4/2014 | Chang ................. G09G 3/3655 327/198 |
| 2016/0140928 A1 | 5/2016 | Xiao |
| 2016/0164514 A1 | 6/2016 | Xiao |
| 2016/0171949 A1 | 6/2016 | Dai |
| 2017/0004795 A1 | 1/2017 | Dai |

FOREIGN PATENT DOCUMENTS

| CN | 104409058 | 3/2015 |
| CN | 104464665 | 3/2015 |
| CN | 104464671 | 3/2015 |
| JP | 2008-131407 | 6/2008 |
| WO | WO 2011/080936 | 7/2011 |

* cited by examiner

*Primary Examiner* — Jason Mandeville

(57) ABSTRACT

The present invention provides a scan-driving circuit used to perform a driving operation on cascaded scanning lines, which comprises a pull-up control module, a pull-up module, a pull-down module, a pull-down sustain module, a down-transmitting module and a bootstrap capacitor. The scan-driving circuit of the present invention enhances the voltage-level control capability of the Q point and raises the reliability of the scan-driving circuit, by disposing a first constant-high voltage and a second constant-high voltage.

18 Claims, 6 Drawing Sheets

SCAN-DRIVING CIRCUIT

REALTED APPLICATIONS

This application is a National Phase of PCT Patent Application No. PCT/CN2015/084339 having International filing date of Jul. 17, 2015, which claims the benefit of priority of Chinese Patent Application No. 201510387843.6 filed on Jul. 3, 2015. The contents of the above applications are all incoprorated by reference as if fully set forth herein in their entirety.

BACKGROUND OF THE INVENTION

Field of Invention

The present invention relates to the field of liquid crystal display technology, and more particularly to a scan-driving circuit.

Description of Prior Art

A Gate Driver on Array is called GOA, which makes scan-driving circuits on an array substrate of the conventional thin-film transistor liquid crystal display, for accomplishing a row-by-row driving method for scanning lines. FIG. 1 shows a schematic diagram of a conventional scan-driving circuit, the scan-driving circuit 10 comprises a pull-up control module 101, a pull-up module 102, a down-transmitting module 103, a pull-down module 104, a bootstrap capacitor 105, and a pull-down sustain module 106.

The scan-driving circuit might have a circuit failure under a manner when the threshold voltages of the elements are mismatching. That is because a voltage-level control capability to a Q point of the pull-down sustain module is decreased when the threshold voltages of the elements are mismatching; namely, the voltage level of the Q point is unable to lift to a high voltage potential so that reliability of the scan-driving circuit is lowered.

Thus, there is a need to provide a scan-driving circuit to solve the problem of the prior art.

SUMMARY OF THE INVENTION

An objective of the present invention is to provide a scan-driving circuit with higher reliability so as to solve the technical problem of the conventional scan-driving circuit with lower reliability.

To achieve the above objective, the embodiment of the present invention provides a scan-driving circuit used to perform a driving operation on cascaded scanning lines, comprising:

A pull-up control module, used to receive down-transmitting signals of previous stage, to generate scanning voltage signals of corresponding scanning lines, according to the down-transmitting signal from the previous stage and a first constant-high voltage;

A pull-up module, used to lift the scanning signals of corresponding scanning lines, according to the scanning voltage signals and clock signals of present stage;

A pull-down module, used to lower the scanning signals of corresponding scanning lines, according to clock signals from next two stage;

A pull-down sustain module, used to sustain a low voltage of the scanning signals of the corresponding scanning lines, according to a second constant-high voltage;

A down-transmitting module, used to transmit down-transmitting signals of the present stage to a pull-up control module of the next stage; and A bootstrap capacitor, used to generate high voltage of the scanning signals of the scanning lines;

Wherein the first constant-high voltage and the second constant-high voltage are respectively generated by a driving chip of a corresponding liquid crystal display panel, wherein the first constant-high voltage is higher than the second constant-high voltage;

The second constant-high voltage is generated by a voltage-division process of the first constant-high voltage.

In the scan-driving circuit of the present invention, the pull-up control module comprises a first switch transistor, a control terminal of the first switch transistor is inputted with the down-transmitting signal from the previous stage, an input terminal of the first switch transistor is inputted with the first constant-high voltage, an output terminal of the first switch transistor is connected with the pull-up module, the pull-down module, the pull-down sustain module, the down-transmitting module, and the bootstrap capacitor;

The pull-up module comprises a second switch transistor, a control terminal of the first switch transistor is connected with the output terminal of the first switch transistor of the pull-up control module, an input terminal of the second switch transistor is inputted with the clock signal of the present stage, an output terminal of the second switch transistor outputs a scanning signal of the present stage;

The down-transmitting module comprises a third switch transistor, a control terminal of the third switch transistor is connected with the first switch transistor of the pull-up control module, an input terminal of the third switch transistor is inputted with the clock signal of the present stage, an output terminal of the third switch transistor outputs the down-transmitting signal of the present stage;

The down-transmitting module comprises a fourth switch transistor and a fifth switch transistor, a control terminal of the fourth switch transistor is connected with the output terminal of the first switch transistor of the pull-up control module, an input terminal of the fourth switch transistor is connected with the output terminal of the first switch transistor of the pull-up control module, an output terminal of the fourth switch transistor is connected with an output terminal of the fifth switch transistor, a control terminal of the fifth switch transistor is inputted with the clock signal from the next two stage, an input terminal of the fifth switch transistor is inputted with the scanning signal of the present stage;

The pull-down sustain module comprises a sixth switch transistor, a seventh switch transistor, an eighth switch transistor, a ninth switch transistor, a tenth switch transistor, an eleventh switch transistor, a twelfth switch transistor, a thirteen switch transistor, a fourteen switch transistor, and a fifteen switch transistor;

A control terminal of the sixth switch transistor is inputted with the second constant-high voltage, an input terminal of the sixth switch transistor is inputted with the second constant-high voltage, an output terminal of the sixth switch transistor is connected with an output terminal of the seventh switch transistor, a control terminal of the eighth switch transistor, and a control terminal of the tenth switch transistor;

A control terminal of the seventh switch transistor is connected with an output terminal of the first switch transistor and a control terminal of the eleventh switch transistor, an input terminal of the seventh switch transistor is connected with a first constant-low voltage;

An input terminal of the eighth switch transistor is inputted with the second constant-high voltage, an output terminal of the eighth switch transistor is connected with an output terminal of the ninth switch transistor, a control terminal of the fourteen switch transistor, and a control terminal of the fifteen switch transistor;

A control terminal of the ninth switch transistor is connected with the output terminal of the first switch transistor, an input terminal of the ninth switch transistor is connected with an output terminal of the tenth switch transistor and an output terminal of the eleventh switch transistor;

An input terminal of the tenth switch transistor is inputted with the second constant-high voltage;

An input terminal of the eleventh switch transistor is connected with a second constant-low voltage;

A control terminal of the twelfth switch transistor is connected with the control terminal of the output terminal of the first switch transistor, an input terminal of the twelfth switch transistor is inputted with the second constant-high voltage, an output terminal of the twelfth switch transistor is connected with an output terminal of the thirteen switch transistor and an output terminal of the fourteen switch transistor;

A control terminal of the thirteen switch transistor is connected with a control terminal of the fifteen switch transistor, an input terminal of the thirteen switch transistor is connected with the second constant-low voltage;

An input terminal of the fourteen switch transistor is connected with the output terminal of the first switch transistor;

An input terminal of the fifteen switch transistor is connected with the first constant-low voltage, an output terminal of the fifteen switch transistor is connected with the output terminal of the second switch transistor.

In the scan-driving circuit of the present invention, the scan-driving circuit further comprises a voltage-division circuit for the voltage-division process;

The voltage-division circuit comprises a first voltage-division switch transistor and a second voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is inputted with a second constant-low voltage, an input terminal of the second voltage-division switch transistor is inputted with a first constant-low voltage;

The output terminal of the first voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the first constant-high voltage, a control terminal of the third voltage-division switch transistor is inputted with a second constant-low voltage, an output terminal of the third voltage-division switch transistor is connected with an output terminal of the fourth voltage-division switch transistor;

A control terminal of the fourth voltage-division switch transistor is inputted with the second constant-low voltage, an input terminal of the second voltage-division switch transistor is inputted with the second constant-low voltage;

The output terminal of the first voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-high voltage;

An input terminal of the third voltage-division switch transistor is inputted with the first constant-high voltage, a control terminal of the third voltage-division switch transistor is inputted with a first constant-high voltage, an output terminal of the third voltage-division switch transistor is connected with an output terminal of the fourth voltage-division switch transistor;

A control terminal of the fourth voltage-division switch transistor is connected with the output terminal of the third voltage-division switch transistor, an input terminal of the fourth voltage-division switch transistor is inputted with the second constant-low voltage;

The output terminal of the first voltage-division switch transistor outputs the second constant-high voltage.

In the scan-driving circuit of the present invention, the second constant-high voltage and the first constant-high voltage are generated by the voltage-division process performed on the main constant-high voltage, wherein the main constant-high voltage is used to generated a high-voltage clock signal and an activating signal.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with a second constant-low voltage, an input terminal of the second voltage-division switch transistor is inputted with a first constant-low voltage;

A control terminal of the third voltage-division switch transistor is connected with the output terminal of the second voltage-division switch transistor, an output terminal of the third voltage-division switch transistor is connected with the output terminal of the second voltage-division switch transistor, an input terminal of the third voltage-division switch transistor is connected with an output terminal of the fourth voltage-division switch transistor;

A control terminal of the fourth voltage-division switch transistor is inputted with the second constant-low voltage, an input terminal of the fourth voltage-division switch transistor is inputted with the first constant-low voltage;

The output terminal of the third voltage-division switch transistor outputs the first constant-high voltage, the output terminal of the fourth voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the main constant-high voltage, a control terminal of the third voltage-division switch transistor is inputted with a second constant-low voltage, an output terminal of the third voltage-division switch transistor is connected with an output terminal of the fourth voltage-division switch transistor;

A control terminal of the fourth voltage-division switch transistor is inputted with the second constant-low voltage, an input terminal of the fourth voltage-division switch transistor is inputted with the second constant-low voltage;

A control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

A control terminal of the sixth voltage-division switch transistor is connected with an output terminal of the eighth voltage-division switch transistor, an input terminal of the sixth voltage-division switch transistor is inputted with the first constant-low voltage;

An output terminal of the seventh voltage-division switch transistor is connected with the output terminal of the second voltage-division switch transistor, a control terminal of the seventh voltage-division switch transistor is inputted with the second constant-low voltage, an input terminal of the seventh voltage-division switch transistor is connected with the control terminal of the sixth voltage-division switch transistor;

A control terminal of the eighth voltage-division switch transistor is inputted with the second constant-low voltage, an input terminal of the eighth voltage-division switch transistor is inputted with the second constant-low voltage;

The output terminal of the fifth voltage-division switch transistor outputs the first constant-high voltage, the output terminal of the sixth voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the main constant-high voltage, a control terminal of the third voltage-division switch transistor is inputted with the main constant-high voltage, an output terminal of the third voltage-division switch transistor is connected with an output terminal of the fourth voltage-division switch transistor;

A control terminal of the fourth voltage-division switch transistor is connected with the output terminal of the third voltage-division switch transistor, an input terminal of the fourth voltage-division switch transistor is inputted with the second constant-low voltage;

A control terminal of the fifth voltage-division switch transistor is connected with an output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

A control terminal of the sixth voltage-division switch transistor is connected with an output terminal of the eighth voltage-division switch transistor, an input terminal of the sixth voltage-division switch transistor is inputted with the first constant-low voltage;

An output terminal of the seventh voltage-division switch transistor is connected with the output terminal of the second voltage-division switch transistor, a control terminal of the seventh voltage-division switch transistor is connected with the output terminal of the second voltage-division switch transistor, an input terminal of the seventh voltage-division switch transistor is connected with the control terminal of the sixth voltage-division switch transistor;

A control terminal of the eighth voltage-division switch transistor is connected with the output terminal of the sixth voltage-division switch transistor, an input terminal of the eighth voltage-division switch transistor is inputted with the second constant-low voltage;

The output terminal of the fifth voltage-division switch transistor outputs the first constant-high voltage, the output terminal of the sixth voltage-division switch transistor outputs the second constant-high voltage.

The embodiment of the present invention further provides a scan-driving circuit, being used to perform a driving operation on cascaded scanning lines, comprising:

A pull-up control module is used to receive down-transmitting signals from previous stage to generate scanning voltage signals of corresponding scanning lines, according to the down-transmitting signal from the previous stage and a first constant-high voltage; a pull-up module, being used to lift the scanning signals of corresponding scanning lines, according to the scanning voltage signals and clock signals of present stage;

A pull-down module, being used to lower the scanning signals of corresponding scanning lines, according to clock signals from next two stage;

A pull-down sustain module, being used to sustain a low voltage of the scanning signals of the corresponding scanning lines, according to a second constant-high voltage;

A down-transmitting module, being used to transmit down-transmitting signals of the present stage to a pull-up control module of the next stage; and A bootstrap capacitor, being used to generate high voltage of the scanning signals of the scanning lines.

In the scan-driving circuit of the present invention, the pull-up control module comprises a first switch transistor, a control terminal of the first switch transistor is inputted with the down-transmitting signal from the previous stage, an input terminal of the first switch transistor is inputted with the first constant-high voltage, an output terminal of the first switch transistor is connected with the pull-up module, the pull-down module, the pull-down sustain module, the down-transmitting module, and the bootstrap capacitor;

The pull-up module comprises a second switch transistor, a control terminal of the first switch transistor is connected with the output terminal of the first switch transistor of the pull-up control module, an input terminal of the second switch transistor is inputted with the clock signal of the present stage, an output terminal of the second switch transistor outputs a scanning signal of the present stage;

The down-transmitting module comprises a third switch transistor, a control terminal of the third switch transistor is connected with the first switch transistor of the pull-up control module, an input terminal of the third switch transistor is inputted with the clock signal of the present stage, an output terminal of the third switch transistor outputs the down-transmitting signal of the present stage;

The down-transmitting module comprises a fourth switch transistor and a fifth switch transistor, a control terminal of the fourth switch transistor is connected with the output terminal of the first switch transistor of the pull-up control module, an input terminal of the fourth switch transistor is connected with the output terminal of the first switch transistor of the pull-up control module, an output terminal of the fourth switch transistor is connected with an output terminal of the fifth switch transistor, a control terminal of the fifth switch transistor is inputted with the clock signal from the next two stage, an input terminal of the fifth switch transistor is inputted with the scanning signal of the present stage;

The pull-down sustain module comprises a sixth switch transistor, a seventh switch transistor, an eighth switch transistor, a ninth switch transistor, a tenth switch transistor, an eleventh switch transistor, a twelfth switch transistor, a thirteenth switch transistor, a fourteenth switch transistor, and a fifteenth switch transistor;

A control terminal of the sixth switch transistor is inputted with the second constant-high voltage, an input terminal of the sixth switch transistor is inputted with the second constant-high voltage, an output terminal of the sixth switch transistor is connected with an output terminal of the seventh switch transistor, a control terminal of the eighth switch transistor, and a control terminal of the tenth switch transistor;

A control terminal of the seventh switch transistor is connected with an output terminal of the first switch transistor and a control terminal of the eleventh switch transistor, an input terminal of the seventh switch transistor is connected with a first constant-low voltage;

An input terminal of the eighth switch transistor is inputted with the second constant-high voltage, an output terminal of the eighth switch transistor is connected with an output terminal of the ninth switch transistor, a control terminal of the fourteenth switch transistor, and a control terminal of the fifteenth switch transistor;

A control terminal of the ninth switch transistor is connected with the output terminal of the first switch transistor, an input terminal of the ninth switch transistor is connected with an output terminal of the tenth switch transistor and an output terminal of the eleventh switch transistor;

An input terminal of the tenth switch transistor is inputted with the second constant-high voltage;

An input terminal of the eleventh switch transistor is connected with a second constant-low voltage;

A control terminal of the twelfth switch transistor is connected with the control terminal of the output terminal of the first switch transistor, an input terminal of the twelfth switch transistor is inputted with the second constant-high voltage, an output terminal of the twelfth switch transistor is connected with an output terminal of the thirteenth switch transistor and an output terminal of the fourteenth switch transistor;

A control terminal of the thirteenth switch transistor is connected with a control terminal of the fifteenth switch transistor, an input terminal of the thirteenth switch transistor is connected with the second constant-low voltage;

An input terminal of the fourteenth switch transistor is connected with the output terminal of the first switch transistor;

An input terminal of the fifteenth switch transistor is connected with the first constant-low voltage, an output terminal of the fifteenth switch transistor is connected with the output terminal of the second switch transistor.

In the scan-driving circuit of the present invention, the first constant-high voltage and the second constant-high voltage are generated by a driving chip of corresponding LCD panel, wherein the first constant-high voltage is higher than the second constant-high voltage;

In the scan-driving circuit of the present invention, the second constant-high voltage is generated by a voltage-division process of the first constant-high voltage.

In the scan-driving circuit of the present invention, the scan-driving circuit further comprises a voltage-division circuit for the voltage-division process;

The voltage-division circuit comprises a first voltage-division switch transistor and a second voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is inputted with a second constant-low voltage, an input terminal of the second voltage-division switch transistor is inputted with a first constant-low voltage;

The output terminal of the first voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the first constant-high voltage, a control terminal of the third voltage-division switch transistor is inputted with a second constant-low voltage, an output terminal of the third voltage-division switch transistor is connected with an output terminal of the fourth voltage-division switch transistor;

A control terminal of the fourth voltage-division switch transistor is inputted with the second constant-low voltage, an input terminal of the second voltage-division switch transistor is inputted with the second constant-low voltage;

The output terminal of the first voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the first constant-high voltage, the control terminal of the first voltage-division switch transistor is inputted with the first constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-high voltage;

An input terminal of the third voltage-division switch transistor is inputted with the first constant-high voltage, a control terminal of the third voltage-division switch transistor is inputted with a first constant-high voltage, an output terminal of the third voltage-division switch transistor is connected with an output terminal of the fourth voltage-division switch transistor;

A control terminal of the fourth voltage-division switch transistor is connected with the output terminal of the third voltage-division switch transistor, an input terminal of the fourth voltage-division switch transistor is inputted with the second constant-low voltage;

The output terminal of the first voltage-division switch transistor outputs the second constant-high voltage.

In the scan-driving circuit of the present invention, the second constant-high voltage and the first constant-high voltage are generated by the voltage-division process performed to the main constant-high voltage, wherein the main constant-high voltage is used to generated a high-voltage clock signal and an activating signal.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, and a fourth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with a second constant-low voltage, an input terminal of the second voltage-division switch transistor is inputted with a first constant-low voltage;

A control terminal of the third voltage-division switch transistor is connected with the output terminal of the second voltage-division switch transistor, an output terminal of the third voltage-division switch transistor is connected with the output terminal of the second voltage-division switch transistor, an input terminal of the third voltage-division switch transistor is connected with an output terminal of the fourth voltage-division switch transistor;

A control terminal of the fourth voltage-division switch transistor is inputted with the second constant-low voltage, an input terminal of the fourth voltage-division switch transistor is inputted with the first constant-low voltage;

The output terminal of the third voltage-division switch transistor outputs the first constant-high voltage, the output terminal of the fourth voltage-division switch transistor outputs the second constant-high voltage;

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the main constant-high voltage, a control terminal of the third voltage-division switch transistor is inputted with a second constant-low voltage, an output terminal of the third voltage-division switch transistor is connected with an output terminal of the fourth voltage-division switch transistor;

A control terminal of the fourth voltage-division switch transistor is inputted with the second constant-low voltage, an input terminal of the fourth voltage-division switch transistor is inputted with the second constant-low voltage;

A control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

A control terminal of the sixth voltage-division switch transistor is connected with an output terminal of the eighth voltage-division switch transistor, an input terminal of the sixth voltage-division switch transistor is inputted with the first constant-low voltage;

An output terminal of the seventh voltage-division switch transistor is connected with the output terminal of the second voltage-division switch transistor, a control terminal of the seventh voltage-division switch transistor is inputted with the second constant-low voltage, an input terminal of the seventh voltage-division switch transistor is connected with the control terminal of the sixth voltage-division switch transistor;

A control terminal of the eighth voltage-division switch transistor is inputted with the second constant-low voltage, an input terminal of the eighth voltage-division switch transistor is inputted with the second constant-low voltage;

The output terminal of the fifth voltage-division switch transistor outputs the first constant-high voltage, the output terminal of the sixth voltage-division switch transistor outputs the second constant-high voltage.

In the scan-driving circuit of the present invention, the scan-driving circuit further comprises a voltage-division circuit for the voltage-division process;

The voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

An input terminal of the first voltage-division switch transistor is inputted with the main constant-high voltage, the control terminal of the first voltage-division switch transistor is inputted with the main constant-high voltage, an output terminal of the first voltage-division switch transistor is connected with an output terminal of the second voltage-division switch transistor;

A control terminal of the second voltage-division switch transistor is connected with an output terminal of the fourth voltage-division switch transistor, an input terminal of the second voltage-division switch transistor is inputted with a first constant-low voltage;

An input terminal of the third voltage-division switch transistor is inputted with the main constant-high voltage, a control terminal of the third voltage-division switch transistor is inputted with the main constant-high voltage, an output terminal of the third voltage-division switch transistor is connected with an output terminal of the fourth voltage-division switch transistor;

A control terminal of the fourth voltage-division switch transistor is connected with the output terminal of the third voltage-division switch transistor, an input terminal of the fourth voltage-division switch transistor is inputted with the second constant-low voltage;

A control terminal of the fifth voltage-division switch transistor is connected with an output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

A control terminal of the sixth voltage-division switch transistor is connected with an output terminal of the eighth voltage-division switch transistor, an input terminal of the sixth voltage-division switch transistor is inputted with the first constant-low voltage;

An output terminal of the seventh voltage-division switch transistor is connected with the output terminal of the second voltage-division switch transistor, a control terminal of the seventh voltage-division switch transistor is connected with the output terminal of the second voltage-division switch transistor, an input terminal of the seventh voltage-division switch transistor is connected with the control terminal of the sixth voltage-division switch transistor;

A control terminal of the eighth voltage-division switch transistor is connected with the output terminal of the sixth voltage-division switch transistor, an input terminal of the eighth voltage-division switch transistor is inputted with the second constant-low voltage;

The output terminal of the fifth voltage-division switch transistor outputs the first constant-high voltage, the output terminal of the sixth voltage-division switch transistor outputs the second constant-high voltage.

Compared with the conventional scan-driving circuit, the scan-driving circuit of the present invention enhances the voltage-level control capability of the Q point and raises the reliability of the scan-driving circuit, by disposing a first constant-high voltage and a second constant-high voltage, to solve the technical problem of the conventional scan-driving circuit with lower reliability.

In order to make the above description of the present invention more easily understood, below are embodiments with accompany drawings and a detailed explanation.

DETAILED DESCRIPTION OF THE PREFERRED EMBODIMENTS

Figure 1:
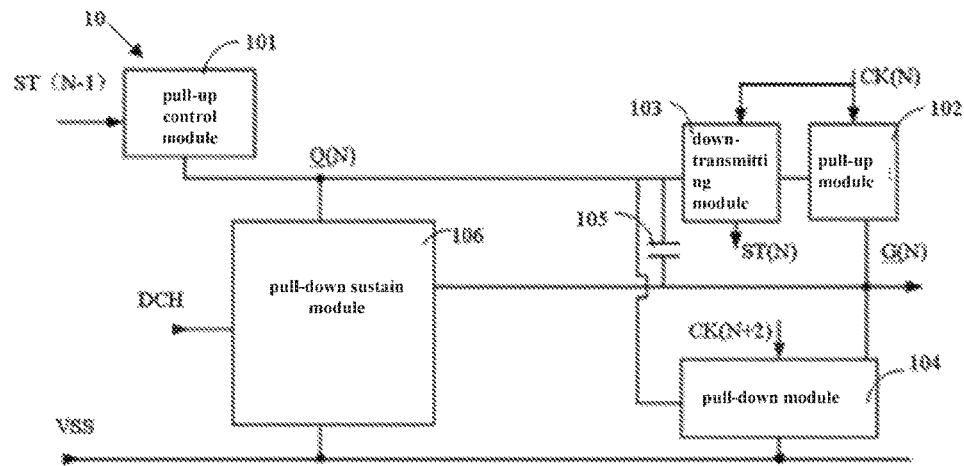
FIG. 1 shows a schematic diagram of a conventional scan-driving circuit.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 2:
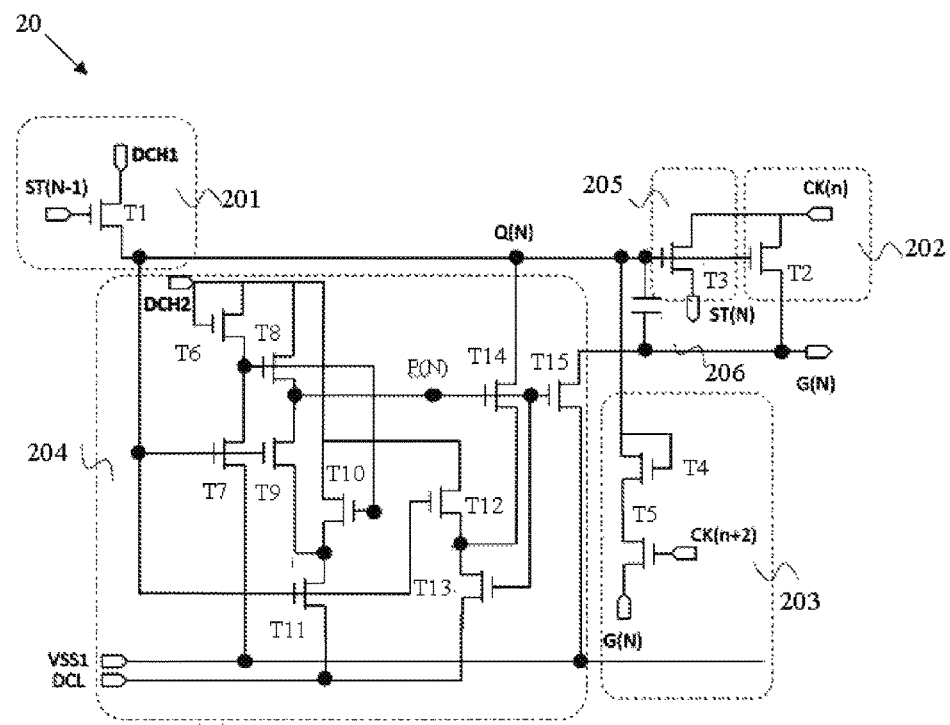
FIG. 2 shows a schematic diagram of the scan-driving circuit according to a preferred embodiment of the present invention.

Please refer to FIG. 2, which is a schematic diagram of the scan-driving circuit according to a preferred embodiment of the present invention. The scan-driving circuit 20 of the preferred embodiment comprises a pull-up control module 201, a pull-up module 202, a pull-down module 203, a pull-down sustain module 204, a down-transmitting module 205, and a bootstrap capacitor 206. The pull-up control module 201 is used to receive down-transmitting signals ST(N−1) from a previous stage to generate scanning voltage signals of corresponding scanning lines Q(N), according to the down-transmitting signals ST(N−1) of the previous stage and a first constant-high voltage DCH1. The pull-up module 202 is used to lift the scanning signals G(N) of corresponding scanning lines G(N), according to the scanning signals Q(N) and clock signals CK(N) of a present stage. The pull-down module 203 is used to lower the scanning signals G(N) of corresponding scanning lines, according to a clock signals CK(N+2) from a next two stage. The pull-down sustain module 204 is used to sustain a low voltage of the scanning signals G(N) of the corresponding scanning lines, according to a second constant-high voltage DCH2. The down-transmitting module 205 is used to transmit down-transmitting signals ST(N) from the present stage to a pull-up control module of the next stage. The bootstrap capacitor 206 is used to generate the high voltage of the scanning signals G(N) of the scanning lines.

The pull-up control module 201 comprises a first switch transistor T1. A control terminal of the first switch transistor T1 is inputted with the down-transmitting signal ST(N−1) of the previous stage, an input terminal of the first switch transistor T1 is inputted with the first constant-high voltage DCH1, and an output terminal of the first switch transistor T1 is connected with the pull-up module 202, the pull-down module 203, the pull-down sustain module 204, the down-transmitting module 205, and the bootstrap capacitor 206.

The pull-up module 202 comprises a second switch transistor T2. A control terminal of the first switch transistor T1 is connected with the output terminal of the first switch transistor T1 of the pull-up control module 201, an input terminal of the second switch transistor T2 is inputted with the clock signal CK(N) of the present stage, and an output terminal of the second switch transistor T2 outputs a scanning signal G(N) of the present stage;

The down-transmitting module 205 comprises a third switch transistor T3. A control terminal of the third switch transistor T3 is connected with the first switch transistor T1 of the pull-up control module 201, an input terminal of the third switch transistor T3 is inputted with the clock signal CK(N) of the present stage, and an output terminal of the third switch transistor T3 outputs the down-transmitting signal ST(N) of the present stage.

The down-transmitting module 205 comprises a fourth switch transistor T4 and a fifth switch transistor T5. A control terminal of the fourth switch transistor T4 is connected with the output terminal of the first switch transistor T1 of the pull-up control module 201, an input terminal of the fourth switch transistor T4 is connected with the output terminal of the first switch transistor T1 of the pull-up control module 201, an output terminal of the fourth switch transistor T4 is connected with an output terminal of the fifth switch transistor T5, a control terminal of the fifth switch transistor T5 is inputted with the clock signal CK(N+2) from the next two stage, and an input terminal of the fifth switch transistor T5 is inputted with the scanning signal G(N) of the present stage;

The pull-down sustain module 204 comprises a sixth switch transistor T6, a seventh switch transistor T7, an eighth switch transistor T8, a ninth switch transistor T9, a tenth switch transistor T10, an eleventh switch transistor T11, a twelfth switch transistor T12, a thirteenth switch transistor T13, a fourteenth switch transistor T14, and a fifteenth switch transistor T15;

A control terminal of the sixth switch transistor T6 is inputted with the second constant-high voltage DCH2, an input terminal of the sixth switch transistor T6 is inputted with the second constant-high voltage DCH2, an output terminal of the sixth switch transistor T6 is connected with an output terminal of the seventh switch transistor T7, a control terminal of the eighth switch transistor T8, and a control terminal of the tenth switch transistor T10;

A control terminal of the seventh switch transistor T7 is connected with an output terminal of the first switch transistor T1 and a control terminal of the eleventh switch transistor T11, an input terminal of the seventh switch transistor T7 is connected with a first constant-low voltage VSS1;

An input terminal of the eighth switch transistor T8 is inputted with the second constant-high voltage DCH2, an output terminal of the eighth switch transistor T8 is connected with an output terminal of the ninth switch transistor T9, a control terminal of the fourteenth switch transistor T14, and a control terminal of the fifteenth switch transistor T15;

A control terminal of the ninth switch transistor T9 is connected with the output terminal of the first switch transistor T1, an input terminal of the ninth switch transistor T9 is connected with an output terminal of the tenth switch transistor T10 and an output terminal of the eleventh switch transistor T11;

An input terminal of the tenth switch transistor T10 is inputted with the second constant-high voltage DCH2; an input terminal of the eleventh switch transistor T11 is connected with a second constant-low voltage DCL;

A control terminal of the twelfth switch transistor T12 is connected with the control terminal of the output terminal of the first switch transistor T1, an input terminal of the twelfth switch transistor T12 is inputted with the second constant-high voltage DCH2, an output terminal of the twelfth switch transistor T12 is connected with an output terminal of the thirteenth switch transistor T13 and an output terminal of the fourteenth switch transistor T14;

A control terminal of the thirteenth switch transistor T13 is connected with a control terminal of the fifteenth switch transistor T15, an input terminal of the thirteenth switch transistor T13 is connected with the second constant-low voltage DCL;

An input terminal of the fourteenth switch transistor T14 is connected with the output terminal of the first switch transistor T1;

An input terminal of the fifteenth switch transistor T15 is connected with the first constant-low voltage VSS1, an output terminal of the fifteenth switch transistor T15 is connected with the output terminal of the second switch transistor T2.

The bootstrap capacitor 206 is disposed between the output terminal of the first switch transistor T1 and the output terminal of the second switch transistor T2 of the pull-up module 202.

During the operation of the scan-driving circuit 20 of the preferred embodiment, when the down-transmitting signals ST(N−1) of the previous stage are at high voltage statuses, the first switch transistor T1 is conducted, the first constant-high voltage DCH1 charges the bootstrap capacitor 206 through the first switch transistor T1, making a reference point Q(N) lift to a higher voltage. Then, the down-transmitting signals ST(N−1) of the previous stage turn to a low voltage status, the first switch transistor T1 is un-conducted, the reference point Q(N) sustained at a higher voltage with the bootstrap capacitor 206, and the second switch transistor T2 and the third switch transistor T3 are conducted.

Then, the current-level clock signals CK(N) turn to high voltage statuses, the clock signals CK(n) charge the bootstrap capacitor 206 through the second switch transistor T2, making the reference point Q(N) lift to a much higher voltage, the current-level scanning signals G(N) and the current-level down-transmitting signals ST(N) both turn to high voltage statuses.

Now, the reference point Q(N) is at a high voltage status, the input terminal of the first switch transistor T1 is connected with the first constant-high voltage DCH1, so the reference point Q(N) does not leak electricity through the first switch transistor T1.

Meanwhile, the seventh switch transistor T7, the ninth switch transistor T9, the eleventh switch transistor T11, and the twelfth switch transistor T12 are conducted, the reference point Q(N) is at a low voltage status, so the fourteenth switch transistor T14 is un-conducted, the second constant-high voltage DCH2 is connected with the output terminals of the twelfth switch transistor T12 and the fourteen switch transistor T14, so the reference point Q(N) does not leak electricity through the fourteenth switch transistor T14.

Meanwhile, the fifth switch transistor T5 is un-conducted. However, the output terminal of the fifth switch transistor T5 is inputted with the current-level scanning signals G(N), and the current-level scanning signals G(N) are at high voltage statuses, so the reference point Q(N) does not leak electricity through the fifth switch transistor T5.

As described above, at a high voltage status, the scan-driving circuit 20 of the present invention does not leak electricity through the first switch transistor T1, the fourteenth switch transistor T14, and the fifth switch transistor T5, the reliability of the scan-driving circuit is raised.

When the clock signal CK(N+2) from the next two stages is at a high voltage status, the fifth switch transistor T5 is conducted, the reference point Q(N) discharges through the pull-down module 203. And the seventh switch transistor T7 is un-conducted, under the function of the sixth switch transistor T6 and the eighth switch transistor T8, so the reference point Q(N) turns to a high voltage, the thirteen switch transistor T13 and the fourteen switch transistor T14 are conducted, the reference point Q(N) is connected with the second constant-low voltage DCL through the thirteenth switch transistor T13 and the fourteenth switch transistor T14, which ensures a low voltage for the reference point Q(N), generating a sustaining function to low voltage scanning signal G(N) of the present stage. After the reference point Q(N) turns to a low voltage, the fourth switch transistor T4 is un-conducted, to ensure a low voltage for the reference point Q(N).

For convenient analysis to the driving circuit, preferably, it is designed that the first constant-low voltage VSS1 is higher than the second constant-low voltage DCL, so as to independently control each element of the scan-driving circuit 20, the specific values of the first constant-low voltage VSS1 and the second constant-low voltage DCL are settable according to actual circumstances.

Meanwhile, it is designed that the first constant-high voltage DCH1 is larger than the second constant-high voltage DCH2, so as to allow the pull-up control module 201 and the pull-down sustain module 204 to be driven by the different constant-high voltage, which is better to avoid the influence of the constant-high voltage caused by mismatching between the elements of the pull-up control module 201 and the pull-down sustain module 204, which ensures the control ability to the Q point and raises the reliability of the scan-driving circuit 20.

The scan-driving circuit 20 of the present invention enhances the voltage-level control capability of the Q point and raises the reliability of the scan-driving circuit, by disposing a first constant-high voltage and a second constant-high voltage.

Figure 3:
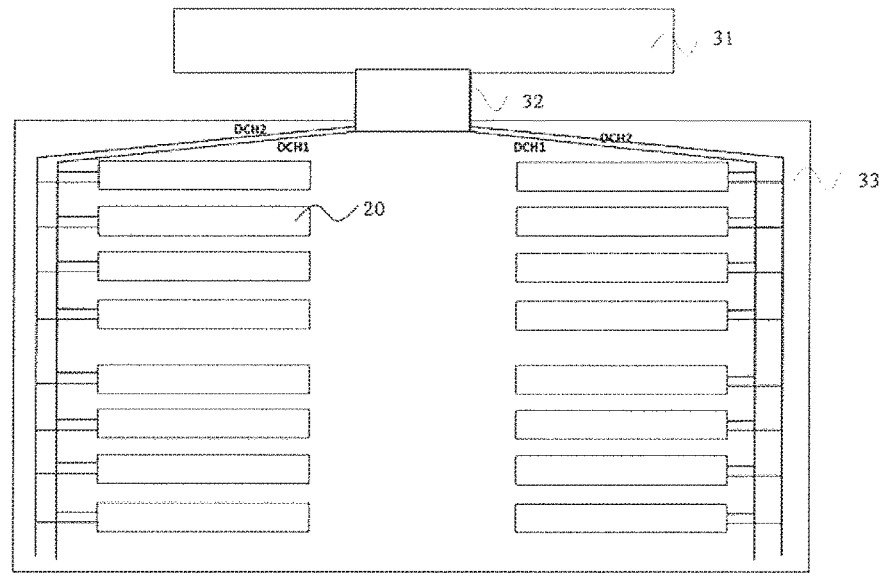
FIG. 3 shows a first schematic diagram of the liquid crystal display panel of the scan-driving circuit of the preferred embodiment of the present invention.

Below is a detailed description about how to disposing the independent first constant-high voltage and the second constant-high voltage. Please refer to FIG. 3, which is a first schematic diagram of the liquid crystal display panel of the scan-driving circuit of the preferred embodiment of the present invention. The liquid crystal display panel comprises a driving chip 31 disposed on the printed circuit board, a flexible connecting board 32, and an array substrate 33. A plurality of cascaded scan-driving circuits 20 is disposed on the array substrate 33 to perform a driving operation on the cascaded scanning lines. Wherein the first constant-high voltage DCH1 and the second constant-high voltage DCH2, applied on the scan-driving circuits 20 of the array substrate 33, are generated by the driving chip 31, and transmitting to the scan-driving circuits 20 of the array substrate 33 through the flexible connecting board 32.

In the preferred embodiment, the first constant-high voltage DCH1 and the second constant-high voltage DCH2 are generated by the driving chip 31, and the first constant-high voltage DCH1 is larger than the second constant-high voltage DCH2.

Figure 4:
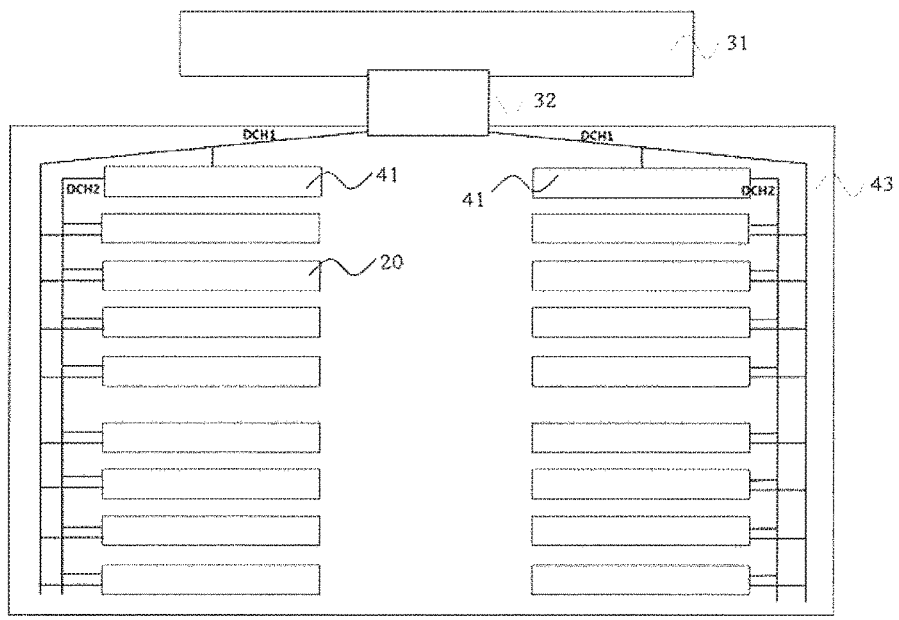
FIG. 4 shows a second schematic diagram of the liquid crystal display panel of the scan-driving circuit of the preferred embodiment of the present invention.

Please refer to FIG. 4, which is a second schematic diagram of the liquid crystal display panel of the scan-driving circuit of the preferred embodiment of the present invention. The liquid crystal display panel also comprises a driving chip 31 disposed on the printed circuit board, a flexible connecting board 32, and an array substrate 43. Moreover, the array substrate 43 further comprises a voltage-division circuit 41 used to perform a voltage-division process on the first constant-high voltage DCH1, then the second constant-high voltage DCH2 is generated by the voltage-division process performed to the first constant-high voltage DCH1.

Figure 5:
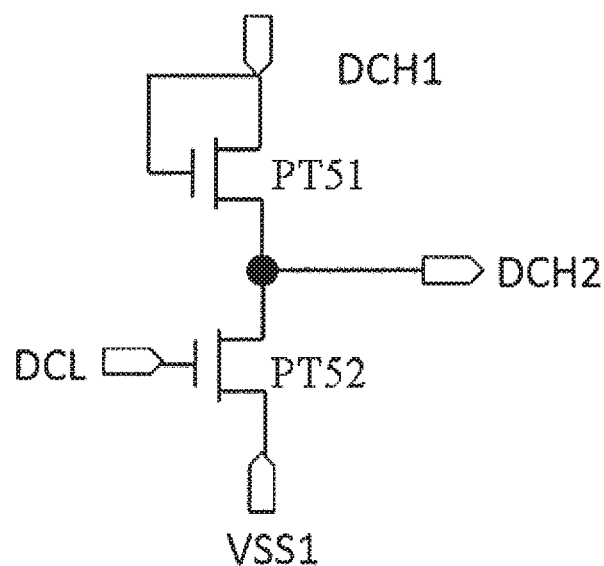
FIG. 5 shows a first schematic diagram of the voltage-division circuit of the scan-driving circuit of FIG. 4.

Please refer to FIG. 5, which is a first schematic diagram of the voltage-division circuit of the scan-driving circuit of FIG. 4. The voltage-division circuit comprises a first voltage-division switch transistor PT51 and a second voltage-division switch transistor PT52.

An input terminal of the first voltage-division switch transistor PT51 is inputted with the first constant-high voltage DCH1, the control terminal of the first voltage-division switch transistor PT51 is inputted with the first constant-high voltage DCH1, an output terminal of the first voltage-division switch transistor PT51 is connected with an output terminal of the second voltage-division switch transistor PT52. A control terminal of the second voltage-division switch transistor PT52 is inputted with a second constant-low voltage DCL, an input terminal of the second voltage-division switch transistor PT52 is inputted with a first constant-low voltage VSS1. The output terminal of the first voltage-division switch transistor PT51 outputs the second constant-high voltage DCH2.

The voltage-division circuit is inputted with the first constant-high voltage DCH1, the first constant-low voltage VSS1, and the second constant-low voltage DCL, and the voltage-division circuit outputs the second constant-high voltage DCH2. With the adjustment of a potential of the second constant-low voltage DCL, it is able to control an output potential of the second constant-high voltage DCH2. The higher the potential of the second constant-low voltage DCL is, the lower the output potential of the second constant-high voltage DCH2 will be, and vice versa.

Figure 6:
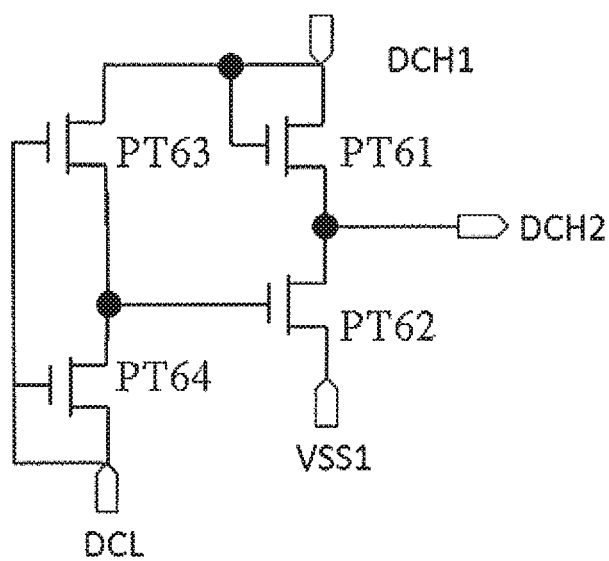
FIG. 6 shows a second schematic diagram of the voltage-division circuit of the scan-driving circuit of FIG. 4.

Please refer to FIG. 6, which is a second schematic diagram of the voltage-division circuit of the scan-driving circuit of FIG. 4. The voltage-division circuit comprises a first voltage-division switch transistor PT61, a second voltage-division switch transistor PT62, a third voltage-division switch transistor PT63, and a fourth voltage-division switch transistor PT64.

An input terminal of the first voltage-division switch transistor PT61 is inputted with the first constant-high voltage DCH1, the control terminal of the first voltage-division switch transistor PT61 is inputted with the first constant-high voltage DCH1, an output terminal of the first voltage-division switch transistor PT61 is connected with an output terminal of the second voltage-division switch transistor PT62. A control terminal of the second voltage-division switch transistor PT62 is connected with an output terminal of the fourth voltage-division switch transistor PT64, an input terminal of the second voltage-division switch transistor PT62 is inputted with a first constant-low voltage VSS1. An input terminal of the third voltage-division switch transistor PT63 is inputted with the first constant-high voltage DCH1, a control terminal of the third voltage-division switch transistor PT63 is inputted with a second constant-low voltage DCL, an output terminal of the third voltage-division switch transistor PT63 is connected with an output terminal of the fourth voltage-division switch transistor PT64. A control terminal of the fourth voltage-division switch transistor PT64 is inputted with the second constant-low voltage DCL, an input terminal of the second voltage-division switch transistor PT62 is inputted with the second constant-low voltage DCL. The output terminal of the first voltage-division switch transistor PT61 outputs the second constant-high voltage DCL.

The voltage-division circuit is inputted with the first constant-high voltage DCH1, the first constant-low voltage VSS1, and the second constant-low voltage DCL, and the voltage-division circuit outputs the second constant-high voltage DCH2. With the adjustment of a potential of the second constant-low voltage DCL, it is able to control an output potential of the second constant-high voltage DCH2. The higher the potential of the second constant-low voltage DCL is, the lower the output potential of the second constant-high voltage DCH2 will be, and vice versa. The scan-driving circuit has higher adjusting precision than the scan-driving circuit of FIG. 5 thereof.

Figure 7:
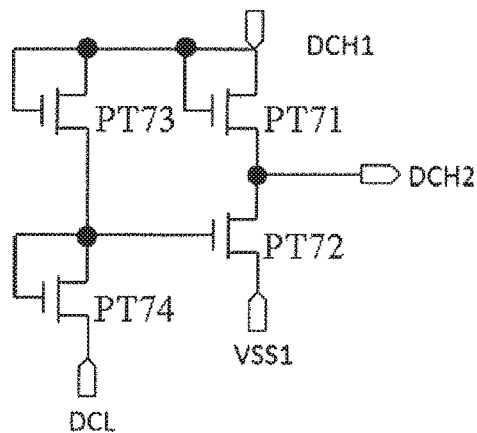
FIG. 7 shows a third schematic diagram of the voltage-division circuit of the scan-driving circuit of FIG. 4.

Please refer to FIG. 7, which is a third schematic diagram of the voltage-division circuit of the scan-driving circuit of FIG. 4. The voltage-division circuit comprises a first voltage-division switch transistor PT71, a second voltage-division switch transistor PT72, a third voltage-division switch transistor PT73, and a fourth voltage-division switch transistor PT74.

An input terminal of the first voltage-division switch transistor PT71 is inputted with the first constant-high voltage DCH1, the control terminal of the first voltage-division switch transistor PT71 is inputted with the first constant-high voltage DCH1, an output terminal of the first voltage-division switch transistor PT71 is connected with an output terminal of the second voltage-division switch transistor PT72. A control terminal of the second voltage-division switch transistor PT72 is connected with an output terminal of the fourth voltage-division switch transistor PT74, an input terminal of the second voltage-division switch transistor PT72 is inputted with a first constant-high voltage VSS1. An input terminal of the third voltage-division switch transistor PT73 is inputted with the first constant-high voltage DCH1, a control terminal of the third voltage-division switch transistor PT73 is inputted with a first constant-high voltage DCH1, an output terminal of the third voltage-division switch transistor PT73 is connected with an output terminal of the fourth voltage-division switch transistor PT74. A control terminal of the fourth voltage-division switch transistor PT74 is connected with the output terminal of the third voltage-division switch transistor PT73, an input terminal of the fourth voltage-division switch transistor PT74 is inputted with the second constant-low voltage DCL. The output terminal of the first voltage-division switch transistor PT71 outputs the second constant-high voltage DCH2.

The voltage-division circuit is inputted with the first constant-high voltage DCH1, the first constant-low voltage VSS1, and the second constant-low voltage DCL, and the voltage-division circuit outputs the second constant-high voltage DCH2. With the adjustment of a potential of the second constant-low voltage DCL, it is able to control an output potential of the second constant-high voltage DCH2. The higher the potential of the second constant-low voltage DCL is, the lower the output potential of the second constant-high voltage DCH2 will be, and vice versa. The scan-driving circuit has higher adjusting precision than the scan-driving circuit of FIG. 5 thereof.

Figure 8:
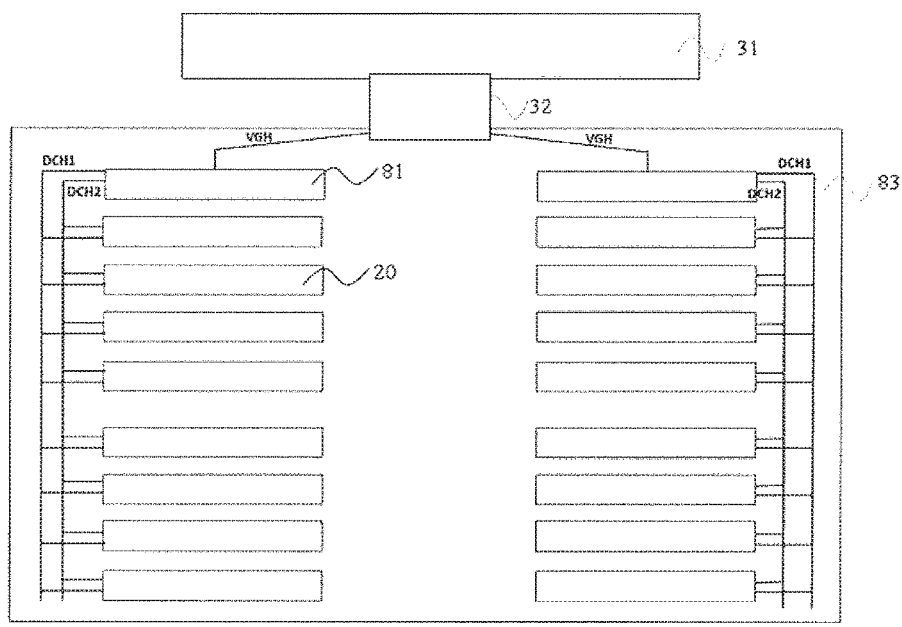
FIG. 8 shows a third schematic diagram of the liquid crystal display panel of the scan-driving circuit of the preferred embodiment of the present invention.

Please refer to FIG. 8, which is a third schematic diagram of the liquid crystal display panel of the scan-driving circuit of the preferred embodiment of the present invention.

The liquid crystal display panel also comprises a driving chip 31 disposed on the printed circuit board, a flexible connecting board 32, and an array substrate 83. Moreover, the array substrate 43 further comprises a voltage-division circuit 81 used to perform a voltage-division process on the first constant-high voltage DCH1, wherein the main constant-high voltage VGH is used to generated a high-voltage clock signal and an activating signal. Then, the second constant-high voltage DCH2 and the first constant-high voltage DCH1 are generated by the voltage-division process performed to the main constant-high voltage VGH. Because the main constant-high voltage VGH is an existing high potential, there is no need to dispose dependently another first constant-high voltage DCH1.

Figure 9:
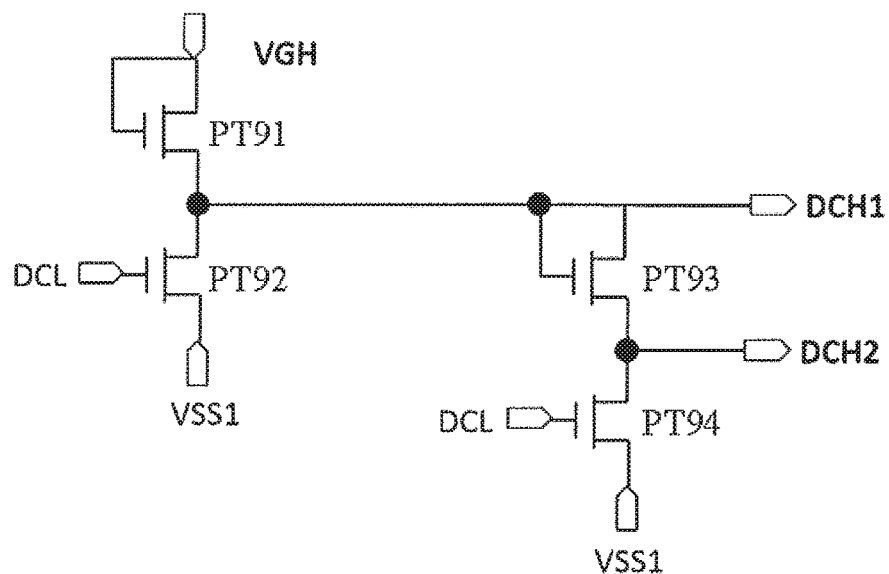
FIG. 9 shows a first schematic diagram of the voltage-division circuit of the scan-driving circuit of FIG. 8.

Please refer to FIG. 9, which is a first schematic diagram of the voltage-division circuit of the scan-driving circuit of FIG. 8. The voltage-division circuit comprises a first voltage-division switch transistor PT91, a second voltage-division switch transistor PT92, a third voltage-division switch transistor PT93, and a fourth voltage-division switch transistor PT94.

An input terminal of the first voltage-division switch transistor PT91 is inputted with the main constant-high voltage VGH, the control terminal of the first voltage-division switch transistor PT91 is inputted with the main constant-high voltage VGH, and an output terminal of the first voltage-division switch transistor PT91 is connected with an output terminal of the second voltage-division switch transistor PT92. A control terminal of the second voltage-division switch transistor PT92 is connected with a second constant-low voltage DCL, and an input terminal of the second voltage-division switch transistor PT92 is inputted with a first constant-low voltage VSS1. A control terminal of the third voltage-division switch transistor PT93 is connected with the output terminal of the second voltage-division switch transistor PT92, an output terminal of the third voltage-division switch transistor PT93 is connected with the output terminal of the second voltage-division switch transistor PT92, an input terminal of the third voltage-division switch transistor PT93 is connected with an output terminal of the fourth voltage-division switch transistor PT94. A control terminal of the fourth voltage-division switch transistor PT94 is inputted with the second constant-low voltage DCL, an input terminal of the fourth voltage-division switch transistor PT94 is inputted with the first constant-low voltage VSS1. The output terminal of the third voltage-division switch transistor PT93 outputs the first constant-high voltage DCH1, the output terminal of the fourth voltage-division switch transistor PT94 outputs the second constant-high voltage DCH2.

The voltage-division circuit is inputted with the main constant-high voltage VGH, the first constant-low voltage VSS1, and the second constant-low voltage DCL, and the voltage-division circuit outputs the first constant-high voltage DCH1 and the second constant-high voltage DCH2. With the adjustment of a potential of the second constant-low voltage DCL, it is able to control output potentials of the first constant-high voltage DCH1 and the second constant-high voltage DCH2. And also with the adjustment of threshold potentials of the voltage-division switch transistors, it is able to control output potentials of the first constant-high voltage DCH1 and the second constant-high voltage DCH2. Because the main constant-high voltage VGH, the first constant-low voltage VSS1, and the second constant-low voltage DCL are existing control signals, there is no need to add new control signal while disposing the first constant-high voltage DCH1 and the second constant-high voltage DCH2.

Figure 10:
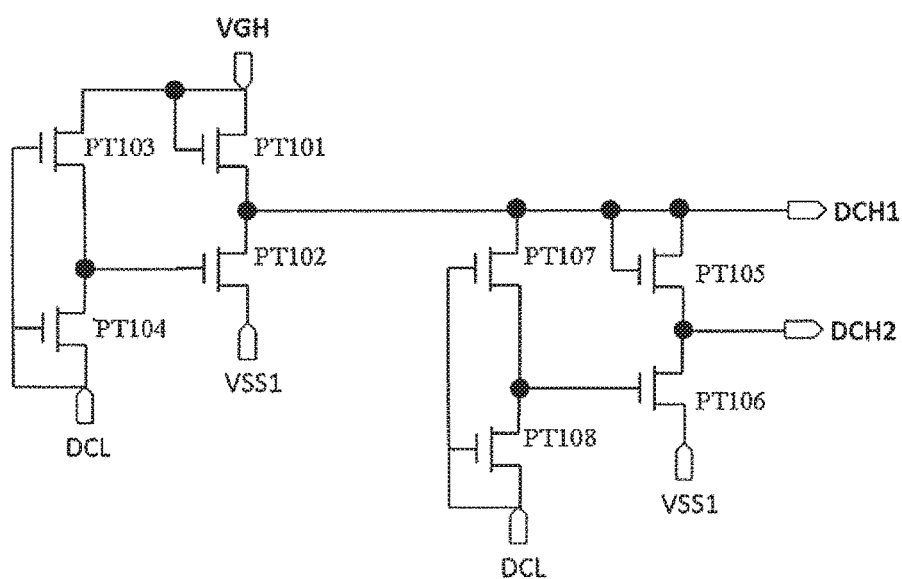
FIG. 10 shows a second schematic diagram of the voltage-division circuit of the scan-driving circuit of FIG. 8.

Please refer to FIG. 10, which is a second schematic diagram of the voltage-division circuit of the scan-driving circuit of FIG. 8. The voltage-division circuit comprises a first voltage-division switch transistor PT101, a second voltage-division switch transistor PT102, a third voltage-division switch transistor PT103, a fourth voltage-division switch transistor PT104, a fifth voltage-division switch transistor PT105, a sixth voltage-division switch transistor TP106, a seventh voltage-division switch transistor PT107, and an eighth voltage-division switch transistor PT108.

An input terminal of the first voltage-division switch transistor PT101 is inputted with the main constant-high voltage VGH, the control terminal of the first voltage-division switch transistor PT101 is inputted with the main constant-high voltage VGH, an output terminal of the first voltage-division switch transistor PT101 is connected with an output terminal of the second voltage-division switch transistor PT102. A control terminal of the second voltage-division switch transistor PT102 is connected with an output terminal of the fourth voltage-division switch transistor PT104, an input terminal of the second voltage-division switch transistor PT102 is inputted with a first constant-low voltage VSS1. An input terminal of the third voltage-division switch transistor PT103 is inputted with the main constant-high voltage VGH, a control terminal of the third voltage-division switch transistor PT103 is inputted with a second constant-low voltage DCL, an output terminal of the third voltage-division switch transistor PT103 is connected with an output terminal of the fourth voltage-division switch transistor PT104. A control terminal of the fourth voltage-division switch transistor PT104 is inputted with the second constant-low voltage DCL, an input terminal of the fourth voltage-division switch transistor PT104 is inputted with the second constant-low voltage DCL. A control terminal of the fifth voltage-division switch transistor PT 105 is connected with the output terminal of the second voltage-division switch transistor PT102, an output terminal of the fifth voltage-division switch transistor PT105 is connected with the output terminal of the second voltage-division switch transistor PT102, an input terminal of the fifth voltage-division switch transistor PT 105 is connected with an output terminal of the sixth voltage-division switch transistor PT106. A control terminal of the sixth voltage-division switch transistor PT106 is connected with an output terminal of the eighth voltage-division switch transistor PT108, an input terminal of the sixth voltage-division switch transistor PT106 is inputted with the first constant-low voltage VSS1. An output terminal of the seventh voltage-division switch transistor PT107 is connected with the output terminal of the second voltage-division switch transistor PT102, a control terminal of the seventh voltage-division switch transistor PT107 is inputted with the second constant-low voltage DCL, an input terminal of the seventh voltage-division switch transistor PT107 is connected with the control terminal of the sixth voltage-division switch transistor PT106. A control terminal of the eighth voltage-division switch transistor PT108 is inputted with the second constant-low voltage DCL, an input terminal of the eighth voltage-division switch transistor PT108 is inputted with the second constant-low voltage DCL. The output terminal of the fifth voltage-division switch transistor PT105 outputs the first constant-high voltage DCH1, the output terminal of the sixth voltage-division switch transistor TP106 outputs the second constant-high voltage DCH2.

The voltage-division circuit is inputted with the main constant-high voltage VGH, the first constant-low voltage VSS1, and the second constant-low voltage DCL, and the voltage-division circuit outputs the first constant-high voltage DCH1 and the second constant-high voltage DCH2. With the adjustment of a potential of the second constant-low voltage DCL, it is able to control output potentials of the first constant-high voltage DCH1 and the second constant-high voltage DCH2, and also with the adjustment of threshold potentials of the voltage-division switch transistors, it is able to control output potentials of the first constant-high voltage DCH1 and the second constant-high voltage DCH2. Because the main constant-high voltage VGH, the first constant-low voltage VSS1, and the second constant-low voltage DCL are existing control signals, there is no need to add new control signal while disposing the first constant-high voltage DCH1 and the second constant-high voltage DCH2. The scan-driving circuit has higher adjusting precision than the scan-driving circuit of FIG. 9 thereof.

Figure 11:
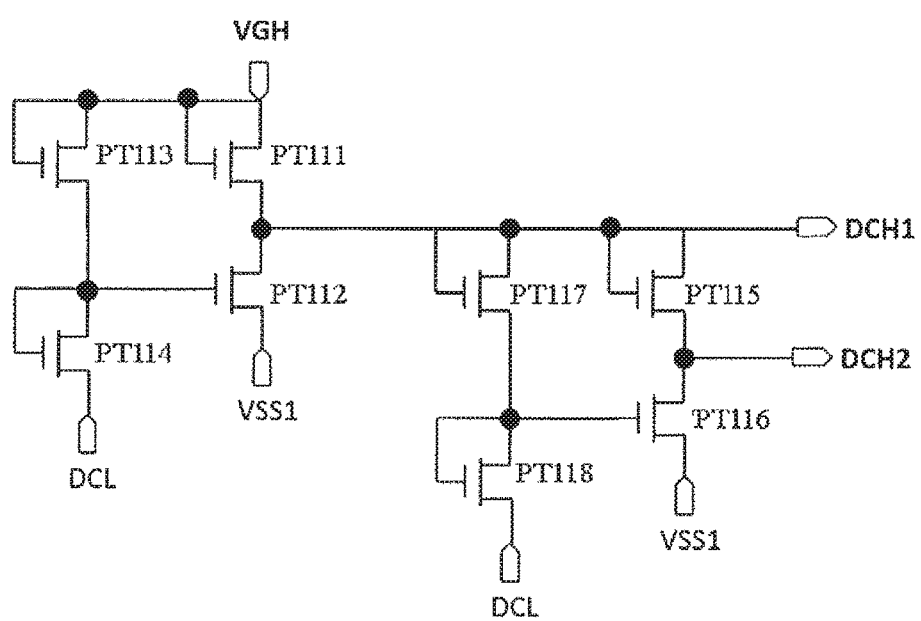
FIG. 11 shows a third schematic diagram of the voltage-division circuit of the scan-driving circuit of FIG. 8.

Please refer to FIG. 11, which is a third schematic diagram of the voltage-division circuit of the scan-driving circuit of FIG. 8. The voltage-division circuit comprises a first voltage-division switch transistor PT111, a second voltage-division switch transistor PT112, a third voltage-division switch transistor PT113, a fourth voltage-division switch transistor PT114, a fifth voltage-division switch transistor PT115, a sixth voltage-division switch transistor PT116, a seventh voltage-division switch transistor PT117, and an eighth voltage-division switch transistor PT118.

An input terminal of the first voltage-division switch transistor PT111 is inputted with the main constant-high voltage VGH, the control terminal of the first voltage-division switch transistor PT111 is inputted with the main constant-high voltage VGH, an output terminal of the first voltage-division switch transistor PT111 is connected with an output terminal of the second voltage-division switch transistor PT112. A control terminal of the second voltage-division switch transistor PT112 is connected with an output terminal of the fourth voltage-division switch transistor PT114, an input terminal of the second voltage-division switch transistor PT112 is inputted with a first constant-low voltage VSS1. An input terminal of the third voltage-division switch transistor PT113 is inputted with the main constant-high voltage VGH, a control terminal of the third voltage-division switch transistor PT113 is inputted with the main constant-high voltage VGH, an output terminal of the third voltage-division switch transistor PT113 is connected with an output terminal of the fourth voltage-division switch transistor PT114. A control terminal of the fourth voltage-division switch transistor PT114 is connected with the output terminal of the third voltage-division switch transistor PT113, an input terminal of the fourth voltage-division switch transistor PT114 is inputted with the second constant-low voltage DCL. A control terminal of the fifth voltage-division switch transistor PT115 is connected with an output terminal of the second voltage-division switch transistor PT112, an output terminal of the fifth voltage-division switch transistor PT115 is connected with the output terminal of the second voltage-division switch transistor PT112, an input terminal of the fifth voltage-division switch transistor PT115 is connected with an output terminal of the sixth voltage-division switch transistor PT116. A control terminal of the sixth voltage-division switch transistor PT116 is connected with an output terminal of the eighth voltage-division switch transistor PT118, an input terminal of the sixth voltage-division switch transistor PT116 is inputted with the first constant-low voltage VSS1. An output terminal of the seventh voltage-division switch transistor PT117 is connected with the output terminal of the second voltage-division switch transistor PT112, a control terminal of the seventh voltage-division switch transistor PT117 is connected with the output terminal of the second voltage-division switch transistor PT112, an input terminal of the seventh voltage-division switch transistor PT117 is connected with the control terminal of the sixth voltage-division switch transistor PT116. A control terminal of the eighth voltage-division switch transistor PT118 is connected with the output terminal of the sixth voltage-division switch transistor PT116, an input terminal of the eighth voltage-division switch transistor PT118 is inputted with the second constant-low voltage DCL. The output terminal of the fifth voltage-division switch transistor PT115 outputs the first constant-high voltage DCH1, the output terminal of the sixth voltage-division switch transistor PT116 outputs the second constant-high voltage DCH2.

The voltage-division circuit is inputted with the main constant-high voltage VGH, the first constant-low voltage VSS1, and the second constant-low voltage DCL, and the voltage-division circuit outputs the first constant-high voltage DCH1 and the second constant-high voltage DCH2. With the adjustment of a potential of the second constant-low voltage DCL, it is able to control output potentials of the first constant-high voltage DCH1 and the second constant-high voltage DCH2, and also with the adjustment of threshold potentials of the voltage-division switch transistors, it is able to control output potentials of the first constant-high voltage DCH1 and the second constant-high voltage DCH2. Because the main constant-high voltage VGH, the first constant-low voltage VSS1, and the second constant-low voltage DCL are existing control signals, there is no need to add new control signal while disposing the first constant-high voltage DCH1 and the second constant-high voltage DCH2. The scan-driving circuit has higher adjusting precision than the scan-driving circuit of FIG. 9.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A scan-driving circuit, used to perform a driving operation on cascaded scanning lines, comprising:
   a pull-up control module receiving an (N−1)th down-transmitting signal and a first constant-high voltage to generate a scanning voltage signal, and connected with a cascaded scanning line at a stage N;
   a pull-up module receiving the scanning voltage signal and an N-th clock signal to lift a scanning signal of the cascaded scanning line, and connected with the cascaded scanning line;
   a pull-down module receiving the scanning signal of the cascaded scanning line and an (N+2)th clock signals to lower the scanning signal of the cascaded scanning line, and connected with the cascaded scanning line;
   a pull-down sustain module receiving a second constant-high voltage and connected with the cascaded scanning line;

a down-transmitting module connected with an (N+1)th pull-up control module for outputting an N-th down-transmitting signal; and a bootstrap capacitor, used to generate a high voltage of the scanning signal of the cascaded scanning line;

wherein the first constant-high voltage and the second constant-high voltage are respectively generated by a driving chip of a corresponding liquid crystal display panel, wherein the first constant-high voltage is higher than the second constant-high voltage;

the second constant-high voltage is generated by a voltage-division process of the first constant-high voltage;

wherein the pull-up control module comprises a first switch transistor, a control terminal of the first switch transistor is inputted with the (N−1)th down-transmitting signal, an input terminal of the first switch transistor is inputted with the first constant-high voltage, an output terminal of the first switch transistor is connected with the pull-up module, the pull-down module, the pull-down sustain module, the down-transmitting module, and the bootstrap capacitor;

the pull-up module comprises a second switch transistor, a control terminal of the second switch transistor is connected with the output terminal of the first switch transistor of the pull-up control module, an input terminal of the second switch transistor is inputted with the N-th clock signal, an output terminal of the second switch transistor outputs an N-th scanning signal;

the down-transmitting module comprises a third switch transistor, a control terminal of the third switch transistor is connected with the output terminal of the first switch transistor of the pull-up control module, an input terminal of the third switch transistor is inputted with the N-th clock signal, an output terminal of the third switch transistor outputs the N-th down-transmitting signal;

the down-transmitting module comprises a fourth switch transistor and a fifth switch transistor, a control terminal of the fourth switch transistor is connected with the output terminal of the first switch transistor of the pull-up control module, an input terminal of the fourth switch transistor is connected with the output terminal of the first switch transistor of the pull-up control module, an output terminal of the fourth switch transistor is connected with an output terminal of the fifth switch transistor, a control terminal of the fifth switch transistor is inputted with the (N+2)th clock signal, an input terminal of the fifth switch transistor is inputted with the N-th scanning signal;

the pull-down sustain module comprises a sixth switch transistor, a seventh switch transistor, an eighth switch transistor, a ninth switch transistor, a tenth switch transistor, an eleventh switch transistor, a twelfth switch transistor, a thirteenth switch transistor, a fourteenth switch transistor, and a fifteenth switch transistor;

a control terminal of the sixth switch transistor is inputted with the second constant-high voltage, an input terminal of the sixth switch transistor is inputted with the second constant-high voltage, an output terminal of the sixth switch transistor is connected with an output terminal of the seventh switch transistor, a control terminal of the eighth switch transistor, and a control terminal of the tenth switch transistor;

a control terminal of the seventh switch transistor is connected with an output terminal of the first switch transistor and a control terminal of the eleventh switch transistor, an input terminal of the seventh switch transistor is connected with a first constant-low voltage;

an input terminal of the eighth switch transistor is inputted with the second constant-high voltage, an output terminal of the eighth switch transistor is connected with an output terminal of the ninth switch transistor, a control terminal of the fourteenth switch transistor, and a control terminal of the fifteenth switch transistor;

a control terminal of the ninth switch transistor is connected with the output terminal of the first switch transistor, an input terminal of the ninth switch transistor is connected with an output terminal of the tenth switch transistor and an output terminal of the eleventh switch transistor;

an input terminal of the tenth switch transistor is inputted with the second constant-high voltage;

an input terminal of the eleventh switch transistor is connected with a second constant-low voltage;

a control terminal of the twelfth switch transistor is connected with the control terminal of the eleventh switch transistor and the output terminal of the first switch transistor, an input terminal of the twelfth switch transistor is inputted with the second constant-high voltage, an output terminal of the twelfth switch transistor is connected with an output terminal of the thirteenth switch transistor and an output terminal of the fourteenth switch transistor;

a control terminal of the thirteenth switch transistor is connected with a control terminal of the fifteenth switch transistor, an input terminal of the thirteenth switch transistor is connected with the second constant-low voltage;

an input terminal of the fourteenth switch transistor is connected with the output terminal of the first switch transistor;

an input terminal of the fifteenth switch transistor is connected with the first constant-low voltage, an output terminal of the fifteenth switch transistor is connected with the output terminal of the second switch transistor.

2. The scan-driving circuit according to claim 1, wherein the scan-driving circuit further comprises a voltage-division circuit for the voltage-division process;

the voltage-division circuit comprises a first voltage-division switch transistor and a second voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is inputted with the second constant-low voltage, an input terminal of the second voltage-division switch transistor is inputted with the first constant-low voltage;

the output terminal of the first voltage-division switch transistor outputs the second constant-high voltage.

3. The scan-driving circuit according to claim 1, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the first constant-high voltage, a control terminal of the third voltage-division switch transistor is inputted with the second constant-low voltage, an output terminal of the third voltage-division switch transistor is connected with an output terminal of the fourth voltage-division switch transistor;

a control terminal of the fourth voltage-division switch transistor is inputted with the second constant-low voltage, an input terminal of the fourth voltage-division switch transistor is inputted with the second constant-low voltage;

the output terminal of the first voltage-division switch transistor outputs the second constant-high voltage.

4. The scan-driving circuit according to claim 1, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-high voltage;

an input terminal of the third voltage-division switch transistor is inputted with the first constant-high voltage, a control terminal of the third voltage-division switch transistor is inputted with the first constant-high voltage, an output terminal of the third voltage-division switch transistor is connected with an output terminal of the fourth voltage-division switch transistor;

a control terminal of the fourth voltage-division switch transistor is connected with the output terminal of the third voltage-division switch transistor, an input terminal of the fourth voltage-division switch transistor is inputted with the second constant-low voltage;

the output terminal of the first voltage-division switch transistor outputs the second constant-high voltage.

5. The scan-driving circuit according to claim 1, wherein the second constant-high voltage and the first constant-high voltage are generated by the voltage-division process performed to a main constant-high voltage, wherein the main constant-high voltage is used to generate a high-voltage clock signal and an activating signal.

6. The scan-driving circuit according to claim 5, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is inputted with the second constant-low voltage, an input terminal of the second voltage-division switch transistor is inputted with the first constant-low voltage;

a control terminal of the third voltage-division switch transistor is connected with the output terminal of the second voltage-division switch transistor, an output terminal of the third voltage-division switch transistor is connected with the output terminal of the second voltage-division switch transistor, an input terminal of the third voltage-division switch transistor is connected with an output terminal of the fourth voltage-division switch transistor;

a control terminal of the fourth voltage-division switch transistor is inputted with the second constant-low voltage, an input terminal of the fourth voltage-division switch transistor is inputted with the first constant-low voltage;

the output terminal of the third voltage-division switch transistor outputs the first constant-high voltage, the output terminal of the fourth voltage-division switch transistor outputs the second constant-high voltage.

7. The scan-driving circuit according to claim 5, wherein the scan-driving circuit further comprises a voltage-division circuit for the voltage-division process;

the voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the main constant-high voltage, a control terminal of the third voltage-division switch transistor is inputted with the second constant-low voltage, an output terminal of the third voltage-division switch transistor is connected with the output terminal of the fourth voltage-division switch transistor;

a control terminal of the fourth voltage-division switch transistor is inputted with the second constant-low voltage, an input terminal of the fourth voltage-division switch transistor is inputted with the second constant-low voltage;

a control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

a control terminal of the sixth voltage-division switch transistor is connected with an output terminal of the eighth voltage-division switch transistor, an input terminal of the sixth voltage-division switch transistor is inputted with the first constant-low voltage;

an output terminal of the seventh voltage-division switch transistor is connected with the output terminal of the second voltage-division switch transistor, a control terminal of the seventh voltage-division switch transistor is inputted with the second constant-low voltage, an input terminal of the seventh voltage-division switch transistor is connected with the control terminal of the sixth voltage-division switch transistor;

a control terminal of the eighth voltage-division switch transistor is inputted with the second constant-low voltage, an input terminal of the eighth voltage-division switch transistor is inputted with the second constant-low voltage;

wherein the output terminal of the fifth voltage-division switch transistor outputs the first constant-high voltage, the output terminal of the sixth voltage-division switch transistor outputs the second constant-high voltage.

8. The scan-driving circuit according to claim 5, wherein the scan-driving circuit further comprises a voltage-division circuit for the voltage-division process;

the voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the main constant-high voltage, a control terminal of the third voltage-division switch transistor is inputted with the main constant-high voltage, an output terminal of the third voltage-division switch transistor is connected with an output terminal of the fourth voltage-division switch transistor;

a control terminal of the fourth voltage-division switch transistor is connected with the output terminal of the third voltage-division switch transistor, an input terminal of the fourth voltage-division switch transistor is inputted with the second constant-low voltage;

a control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

a control terminal of the sixth voltage-division switch transistor is connected with an output terminal of the eighth voltage-division switch transistor, an input terminal of the sixth voltage-division switch transistor is inputted with the first constant-low voltage;

an output terminal of the seventh voltage-division switch transistor is connected with the output terminal of the second voltage-division switch transistor, a control terminal of the seventh voltage-division switch transistor is connected with the output terminal of the second voltage-division switch transistor, an input terminal of the seventh voltage-division switch transistor is connected with the control terminal of the sixth voltage-division switch transistor;

a control terminal of the eighth voltage-division switch transistor is connected with the output terminal of the eighth voltage-division switch transistor, an input terminal of the eighth voltage-division switch transistor is inputted with the second constant-low voltage;

wherein the output terminal of the fifth voltage-division switch transistor outputs the first constant-high voltage, the output terminal of the sixth voltage-division switch transistor outputs the second constant-high voltage.

9. A scan-driving circuit, being used to perform a driving operation on cascaded scanning lines, comprising:

a pull-up control module receiving an (N−1)th down-transmitting signal and a first constant-high voltage to generate a scanning voltage signal, and connected with a cascaded scanning line at a stage N;

a pull-up module receiving the scanning voltage signal and an N-th clock signal to lift a scanning signal of the cascaded scanning line, and connected with the cascaded scanning line;

a pull-down module receiving the scanning signal of the cascaded scanning line and (N+2)th clock signals to lower the scanning signal of the cascaded scanning line, and connected with the cascaded scanning line;

a pull-down sustain module receiving a second constant-high voltage and connected with the cascaded scanning line;

a down-transmitting module connected with an (N+1)th pull-up control module for outputting an N-th down-transmitting signal; and a bootstrap capacitor, being used to generate a high voltage of the scanning signal of the cascaded scanning line;

wherein the pull-up control module comprises a first switch transistor, a control terminal of the first switch transistor is inputted with the (N−1)th down-transmitting signal, an input terminal of the first switch transistor is inputted with the first constant-high voltage, an output terminal of the first switch transistor is connected with the pull-up module, the pull-down module, the pull-down sustain module, the down-transmitting module, and the bootstrap capacitor;

the pull-up module comprises a second switch transistor, a control terminal of the second switch transistor is connected with the output terminal of the first switch transistor of the pull-up control module, an input terminal of the second switch transistor is inputted with the N-th clock signal, an output terminal of the second switch transistor outputs an N-th scanning signal;

the down-transmitting module comprises a third switch transistor, a control terminal of the third switch transistor is connected with the output terminal of the first switch transistor of the pull-up control module, an input terminal of the third switch transistor is inputted with the N-th clock signal, an output terminal of the third switch transistor outputs the N-th down-transmitting signal;

the down-transmitting module comprises a fourth switch transistor and a fifth switch transistor, a control terminal of the fourth switch transistor is connected with the output terminal of the first switch transistor of the pull-up control module, an input terminal of the fourth switch transistor is connected with the output terminal of the first switch transistor of the pull-up control module, an output terminal of the fourth switch transistor is connected with an output terminal of the fifth switch transistor, a control terminal of the fifth switch transistor is inputted with the (N+2)th clock signal, an input terminal of the fifth switch transistor is inputted with the N-th scanning signal;

the pull-down sustain module comprises a sixth switch transistor, a seventh switch transistor, an eighth switch transistor, a ninth switch transistor, a tenth switch transistor, an eleventh switch transistor, a twelfth switch transistor, a thirteenth switch transistor, a fourteenth switch transistor, and a fifteenth switch transistor;

a control terminal of the sixth switch transistor is inputted with the second constant-high voltage, an input terminal of the sixth switch transistor is inputted with the second constant-high voltage, an output terminal of the sixth switch transistor is connected with an output terminal of the seventh switch transistor, a control terminal of the eighth switch transistor, and a control terminal of the tenth switch transistor;

a control terminal of the seventh switch transistor is connected with an output terminal of the first switch transistor and a control terminal of the eleventh switch transistor, an input terminal of the seventh switch transistor is connected with a first constant-low voltage;

an input terminal of the eighth switch transistor is inputted with the second constant-high voltage, an output terminal of the eighth switch transistor is connected with an output terminal of the ninth switch transistor, a control terminal of the fourteenth switch transistor, and a control terminal of the fifteenth switch transistor;

a control terminal of the ninth switch transistor is connected with the output terminal of the first switch transistor, an input terminal of the ninth switch transistor is connected with an output terminal of the tenth switch transistor and an output terminal of the eleventh switch transistor;

an input terminal of the tenth switch transistor is inputted with the second constant-high voltage;

an input terminal of the eleventh switch transistor is connected with a second constant-low voltage;

a control terminal of the twelfth switch transistor is connected with the control terminal of the eleventh switch transistor and the output terminal of the first switch transistor, an input terminal of the twelfth switch transistor is inputted with the second constant-high voltage, an output terminal of the twelfth switch transistor is connected with an output terminal of the thirteenth switch transistor and an output terminal of the fourteenth switch transistor;

a control terminal of the thirteenth switch transistor is connected with a control terminal of the fifteenth switch transistor, an input terminal of the thirteenth switch transistor is connected with the second constant-low voltage;

an input terminal of the fourteenth switch transistor is connected with the output terminal of the first switch transistor;

an input terminal of the fifteenth switch transistor is connected with the first constant-low voltage, an output terminal of the fifteenth switch transistor is connected with the output terminal of the second switch transistor.

10. The scan-driving circuit according to claim 9, wherein the first constant-high voltage and the second constant-high voltage are generated by a driving chip of a corresponding LCD (liquid crystal display) panel, wherein the first constant-high voltage is higher than the second constant-high voltage.

11. The scan-driving circuit according to claim 9, wherein the second constant-high voltage is generated by a voltage-division process of the first constant-high voltage.

12. The scan-driving circuit according to claim 11, wherein the scan-driving circuit further comprises a voltage-division circuit for the voltage-division process;

the voltage-division circuit comprises a first voltage-division switch transistor and a second voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is inputted with the second constant-low voltage, an input terminal of the second voltage-division switch transistor is inputted with the first constant-low voltage;

the output terminal of the first voltage-division switch transistor outputs the second constant-high voltage.

13. The scan-driving circuit according to claim 11, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the first constant-high voltage, a control terminal of the third voltage-division switch transistor is inputted with the second constant-low voltage, an output terminal of the third voltage-division switch transistor is connected with an output terminal of the fourth voltage-division switch transistor;

a control terminal of the fourth voltage-division switch transistor is inputted with the second constant-low voltage, an input terminal of the fourth voltage-division switch transistor is inputted with the second constant-low voltage;

the output terminal of the first voltage-division switch transistor outputs the second constant-high voltage.

14. The scan-driving circuit according to claim 11, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the first constant-high voltage, a control terminal of the first voltage-division switch transistor is inputted with the first constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-high voltage;

an input terminal of the third voltage-division switch transistor is inputted with the first constant-high voltage, a control terminal of the third voltage-division switch transistor is inputted with the first constant-high voltage, an output terminal of the third voltage-division switch transistor is connected with an output terminal of the fourth voltage-division switch transistor;

a control terminal of the fourth voltage-division switch transistor is connected with the output terminal of the third voltage-division switch transistor, an input terminal of the fourth voltage-division switch transistor is inputted with the second constant-low voltage;

the output terminal of the first voltage-division switch transistor outputs the second constant-high voltage.

15. The scan-driving circuit according to claim 11, wherein the second constant-high voltage and the first constant-high voltage are generated by the voltage-division process performed to a main constant-high voltage, wherein the main constant-high voltage is used to generate a high-voltage clock signal and an activating signal.

16. The scan-driving circuit according to claim 15, wherein the scan-driving circuit further comprises a voltage-division circuit for the voltage-division process;

the voltage-division circuit comprises a first voltage-division switch transistor, a second voltage-division switch transistor, a third voltage-division switch transistor, and a fourth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is inputted with the second constant-low voltage, an input terminal of the second voltage-division switch transistor is inputted with the first constant-low voltage;

a control terminal of the third voltage-division switch transistor is connected with the output terminal of the second voltage-division switch transistor, an output terminal of the third voltage-division switch transistor is connected with the output terminal of the second voltage-division switch transistor, an input terminal of the third voltage-division switch transistor is connected with an output terminal of the fourth voltage-division switch transistor;

a control terminal of the fourth voltage-division switch transistor is inputted with the second constant-low voltage, an input terminal of the fourth voltage-division switch transistor is inputted with the first constant-low voltage;

the output terminal of the third voltage-division switch transistor outputs the first constant-high voltage, the output terminal of the fourth voltage-division switch transistor outputs the second constant-high voltage.

17. The scan-driving circuit according to claim 15, wherein the scan-driving circuit further comprises a voltage-division circuit for the voltage-division process;

the voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the main constant-high voltage, a control terminal of the third voltage-division switch transistor is inputted with the second constant-low voltage, an output terminal of the third voltage-division switch transistor is connected with the output terminal of the fourth voltage-division switch transistor;

a control terminal of the fourth voltage-division switch transistor is inputted with the second constant-low voltage, an input terminal of the fourth voltage-division switch transistor is inputted with the second constant-low voltage;

a control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

a control terminal of the sixth voltage-division switch transistor is connected with an output terminal of the eighth voltage-division switch transistor, an input terminal of the sixth voltage-division switch transistor is inputted with the first constant-low voltage;

an output terminal of the seventh voltage-division switch transistor is connected with the output terminal of the second voltage-division switch transistor, a control terminal of the seventh voltage-division switch transistor is inputted with the second constant-low voltage, an input terminal of the seventh voltage-division switch transistor is connected with the control terminal of the sixth voltage-division switch transistor;

a control terminal of the eighth voltage-division switch transistor is inputted with the second constant-low voltage, an input terminal of the eighth voltage-division switch transistor is inputted with the second constant-low voltage;

wherein the output terminal of the fifth voltage-division switch transistor outputs the first constant-high voltage, the output terminal of the sixth voltage-division switch transistor outputs the second constant-high voltage.

18. The scan-driving circuit according to claim 15, wherein the scan-driving circuit further comprises a voltage-division circuit for the voltage-division process;

the voltage-division circuit comprises a first voltage-division switch transistor, a second voltage-division switch transistor, a third voltage-division switch transistor, a fourth voltage-division switch transistor, a fifth voltage-division switch transistor, a sixth voltage-division switch transistor, a seventh voltage-division switch transistor, and an eighth voltage-division switch transistor;

an input terminal of the first voltage-division switch transistor is inputted with the main constant-high voltage, a control terminal of the first voltage-division switch transistor is inputted with the main constant-high voltage, an output terminal of the first voltage-division switch transistor is connected with an output terminal of the second voltage-division switch transistor;

a control terminal of the second voltage-division switch transistor is connected with an output terminal of the fourth voltage-division switch transistor, an input terminal of the second voltage-division switch transistor is inputted with the first constant-low voltage;

an input terminal of the third voltage-division switch transistor is inputted with the main constant-high voltage, a control terminal of the third voltage-division switch transistor is inputted with the main constant-high voltage, an output terminal of the third voltage-division switch transistor is connected with an output terminal of the fourth voltage-division switch transistor;

a control terminal of the fourth voltage-division switch transistor is connected with the output terminal of the third voltage-division switch transistor, an input terminal of the fourth voltage-division switch transistor is inputted with the second constant-low voltage;

a control terminal of the fifth voltage-division switch transistor is connected with the output terminal of the second voltage-division switch transistor, an output terminal of the fifth voltage-division switch transistor is connected with the output terminal of the second voltage-division switch transistor, an input terminal of the fifth voltage-division switch transistor is connected with an output terminal of the sixth voltage-division switch transistor;

a control terminal of the sixth voltage-division switch transistor is connected with an output terminal of the eighth voltage-division switch transistor, an input terminal of the sixth voltage-division switch transistor is inputted with the first constant-low voltage;

an output terminal of the seventh voltage-division switch transistor is connected with the output terminal of the second voltage-division switch transistor, a control terminal of the seventh voltage-division switch transistor is connected with the output terminal of the second voltage-division switch transistor, an input terminal of the seventh voltage-division switch transistor is connected with the control terminal of the sixth voltage-division switch transistor;

a control terminal of the eighth voltage-division switch transistor is connected with the output terminal of the eighth voltage-division switch transistor, an input terminal of the eighth voltage-division switch transistor is inputted with the second constant-low voltage;

wherein the output terminal of the fifth voltage-division switch transistor outputs the first constant-high voltage, the output terminal of the sixth voltage-division switch transistor outputs the second constant-high voltage.

* * * * *